(12) United States Patent
Suresh et al.

(10) Patent No.: US 10,381,341 B2
(45) Date of Patent: Aug. 13, 2019

(54) TRANSIENT-VOLTAGE-SUPPRESSION (TVS) DIODE DEVICE AND METHOD OF FABRICATING THE SAME

(71) Applicant: Nuvoton Technology Corporation, Hsinchu Science Park (TW)

(72) Inventors: Vinay Suresh, Bangalore (IN); Po-An Chen, Toufen (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 337 days.

(21) Appl. No.: 15/584,597

(22) Filed: May 2, 2017

(65) Prior Publication Data

US 2018/0175018 A1 Jun. 21, 2018

(30) Foreign Application Priority Data

Dec. 21, 2016 (TW) .............................. 105142420 A

(51) Int. Cl.
*H01L 27/02* (2006.01)
*H01L 29/866* (2006.01)
(Continued)

(52) U.S. Cl.
CPC ...... *H01L 27/0255* (2013.01); *H01L 27/0814* (2013.01); *H01L 29/0649* (2013.01);
(Continued)

(58) Field of Classification Search
CPC ............. H01L 27/0248; H01L 27/0255; H01L 27/075; H01L 27/0814; H01L 29/866;
(Continued)

(56) References Cited

U.S. PATENT DOCUMENTS

2010/0244090 A1* 9/2010 Bobde ................. H01L 27/0259
257/112
2012/0295414 A1 11/2012 Zhan et al.
(Continued)

FOREIGN PATENT DOCUMENTS

TW 201546997 A 12/2015

OTHER PUBLICATIONS

An Office Action with ISR from corresponding TW Application No. 105142420 dated May 25, 2017; 4 pgs.

*Primary Examiner* — Kevin J Comber
(74) *Attorney, Agent, or Firm* — Muncy, Geissler, Olds & Lowe, P.C.

(57) ABSTRACT

A transient-voltage-suppression (TVS) diode device and a method of fabricating the same are disclosed. The TVS diode device includes a substrate. A second conductivity type first epitaxial layer is disposed over the substrate. A second conductivity type second epitaxial layer is disposed between the second conductivity type first epitaxial layer and the substrate. A plurality of trench isolation features divides the substrate into a first active region including a second conductivity type doped well region disposed in the second conductivity type first epitaxial layer. A first conductivity type doped well region and a first conductivity type buried layer are disposed in the second conductivity type second epitaxial layer. The second conductivity type doped well region and the first conductivity type buried layer collectively form a Zener diode.

17 Claims, 10 Drawing Sheets

(51) Int. Cl.
  *H01L 29/74* (2006.01)
  *H01L 29/06* (2006.01)
  *H01L 29/66* (2006.01)
  *H01L 29/861* (2006.01)
  *H01L 27/08* (2006.01)

(52) U.S. Cl.
  CPC .... *H01L 29/66106* (2013.01); *H01L 29/7412* (2013.01); *H01L 29/861* (2013.01); *H01L 29/866* (2013.01); *H01L 29/8611* (2013.01); *H01L 29/8613* (2013.01)

(58) Field of Classification Search
  CPC ............. H01L 29/7412; H01L 29/0649; H01L 29/66106; H01L 29/861; H01L 29/8611; H01L 29/8613
  See application file for complete search history.

(56) References Cited

U.S. PATENT DOCUMENTS

| | | | |
|---|---|---|---|
| 2013/0001694 A1* | 1/2013 | Guan | H01L 27/0255 257/355 |
| 2014/0126091 A1 | 5/2014 | Gill et al. | |
| 2014/0319598 A1* | 10/2014 | Bobde | H01L 27/0629 257/328 |
| 2017/0084601 A1* | 3/2017 | Yao | H01L 27/0255 |

* cited by examiner

TRANSIENT-VOLTAGE-SUPPRESSION (TVS) DIODE DEVICE AND METHOD OF FABRICATING THE SAME

CROSS REFERENCE TO RELATED APPLICATIONS

This Application claims priority of Taiwan Patent Application No. 105142420, filed on Dec. 21, 2016, the entirety of which is incorporated by reference herein.

BACKGROUND OF THE INVENTION

Field of the Invention

The present invention relates to a semiconductor device and a method for fabricating the same, and in particular to a transient-voltage-suppression (TVS) diode device and a method for fabricating the same.

Description of the Related Art

Transient-voltage-suppression (TVS) diode devices are commonly applied for protecting integrated circuits from damage due to the transient voltage inadvertently exceeding the circuit's normal operating voltage. This can happen, for example, when electrostatic discharge (ESD), electrical fast transients, or lightning affect the integrated circuit. When the transient voltage exceeds the circuit's normal operating voltage, the TVS diode device rapidly becomes a low-impedance path for the transient current. Also, the operating circuit's voltage is clamped to a predetermined maximum clamping voltage. Exemplary applications of the TVS diode device can be found in the universal serial bus (USB) power and data line protection, the digital video interface, high-speed Ethernet, notebook computers, monitors, and flat panel displays. However, the device configurations and method for fabricating the TVS diode devices are still confronted with technical challenges to the further reduction of capacitance while maintaining a simplified and low-cost manufacturing process and shrinking the area occupied by the TVS chips.

Thus, a novel transient-voltage-suppression (TVS) diode device is needed in order to overcome these technical challenges.

BRIEF SUMMARY OF THE INVENTION

Exemplary embodiments of a transient-voltage-suppression (TVS) diode device and a method for fabricating the same are provided. The transient-voltage-suppression (TVS) diode device includes a substrate having a first conductivity type. A second conductivity type first epitaxial layer is disposed over the substrate, wherein the second conductivity type first epitaxial layer has a second conductivity type that is different from the first conductivity type. A second conductivity type second epitaxial layer is disposed between the second conductivity type first epitaxial layer and the substrate, wherein the second conductivity type second epitaxial layer has the second conductivity type. A plurality of trench isolation features is formed extending into the substrate from the top surface of the second conductivity type first epitaxial layer and passing through the bottom surface of the second conductivity type second epitaxial layer, wherein the plurality of trench isolation features close to each other divide the substrate into a first active region. The first active region includes a second conductivity type doped well region disposed in the second conductivity type first epitaxial layer, having the second conductivity type. A first conductivity type doped well region is disposed in the second conductivity type second epitaxial layer, having the first conductivity type. A first conductivity type buried layer is disposed in the second conductivity type second epitaxial layer. The second conductivity type doped well region and the first conductivity type buried layer collectively form a Zener diode.

Another exemplary embodiment of a transient-voltage-suppression (TVS) diode device includes a substrate having a first conductivity type. A second conductivity type first epitaxial layer and a second conductivity type second epitaxial layer are disposed over the substrate, wherein the top surface and the bottom surface of the second conductivity type second epitaxial layer are positioned adjacent to the second conductivity type first epitaxial layer and the substrate, respectively. The second conductivity type first epitaxial layer and the second conductivity type second epitaxial layer have a second conductivity type that is different from the first conductivity type. A Zener diode is formed in the second conductivity type first epitaxial layer and the second conductivity type second epitaxial layer. The Zener diode includes a first conductivity type doped well region disposed in the second conductivity type second epitaxial layer, wherein the first conductivity type doped well region has the first conductivity type. A second conductivity type doped well region is disposed in the second conductivity type first epitaxial layer, wherein the second conductivity type doped well region has the second conductivity type. A first conductivity type buried layer disposed in the second conductivity type second epitaxial layer, wherein the first conductivity type buried layer has the first conductivity type.

An exemplary embodiment of a method for fabricating a transient-voltage-suppression (TVS) diode device includes providing a substrate having a first conductivity type. The substrate includes a plurality of defined regions for a plurality of trench isolation features. The plurality of defined regions divides the substrate into a first active region, a second active region, a third active region, a fourth active region and a fifth active region. A first epitaxial growth process is performed to epitaxially grow a second conductivity type epitaxial layer, wherein the second conductivity type epitaxial layer has a second conductivity type that is different from the first conductivity type. A first doping process is performed to form a first conductivity type doped well region in the second conductivity type epitaxial layer within the first active region. The first conductivity type doped well region has the first conductivity type. A second doping process is performed to form a first conductivity type buried layer on the first conductivity type doped well region within the first active region, wherein the first conductivity type buried layer has the first conductivity type. A second epitaxial growth process is performed to epitaxially grow another second conductivity type epitaxial layer on the second conductivity type epitaxial layer, wherein the other second conductivity type epitaxial layer has the second conductivity type. A third doping process is performed to form a second conductivity type doped well region in the other second conductivity type epitaxial layer within the first active region, wherein the second conductivity type doped well region has the second conductivity type. A plurality of trench isolation features is formed in the plurality of defined regions for a plurality of trench isolation features, wherein the plurality of trench isolation features is formed extending into the substrate from the top surface of the other second conductivity type epitaxial layer and passing through the bottom surface of the second conductivity type epitaxial layer.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Embodiments provide a transient-voltage-suppression (TVS) diode device. The Zener diode formed in the TVS diode device has a stable reverse breakdown voltage. Additionally, the TVS diode device is constructed by two thin epitaxial layers formed by two epitaxial layer growth processes, so that the fabrication steps of the TVS diode device may be simple and the fabrication cost may be reduced.

FIGS. 1-6 are schematic cross-sectional views showing intermediate stages of a method for fabricating a transient-voltage-suppression (TVS) diode device 500a in accordance with some embodiments of the disclosure. Please refer to FIG. 1. First, a substrate 200 is provided. The substrate 200 has a first conductivity type by doping dopants. For example, when the first conductivity type is P-type, and the substrate 200 may serve as a P-type substrate. In some embodiments, the dopant concentration of the substrate 200 is about $10^{19}$-$10^{21}$/cm$^3$, so that the substrate 200 may serve as a heavily doped P-type substrate. In some embodiments, the substrate 200 may comprise a silicon substrate. In some other embodiments, a SiGe substrate, a bulk semiconductor substrate, a strained semiconductor substrate, a compound semiconductor substrate or other commonly used semiconductor substrates can be used as the substrate 200.

Figure 1:
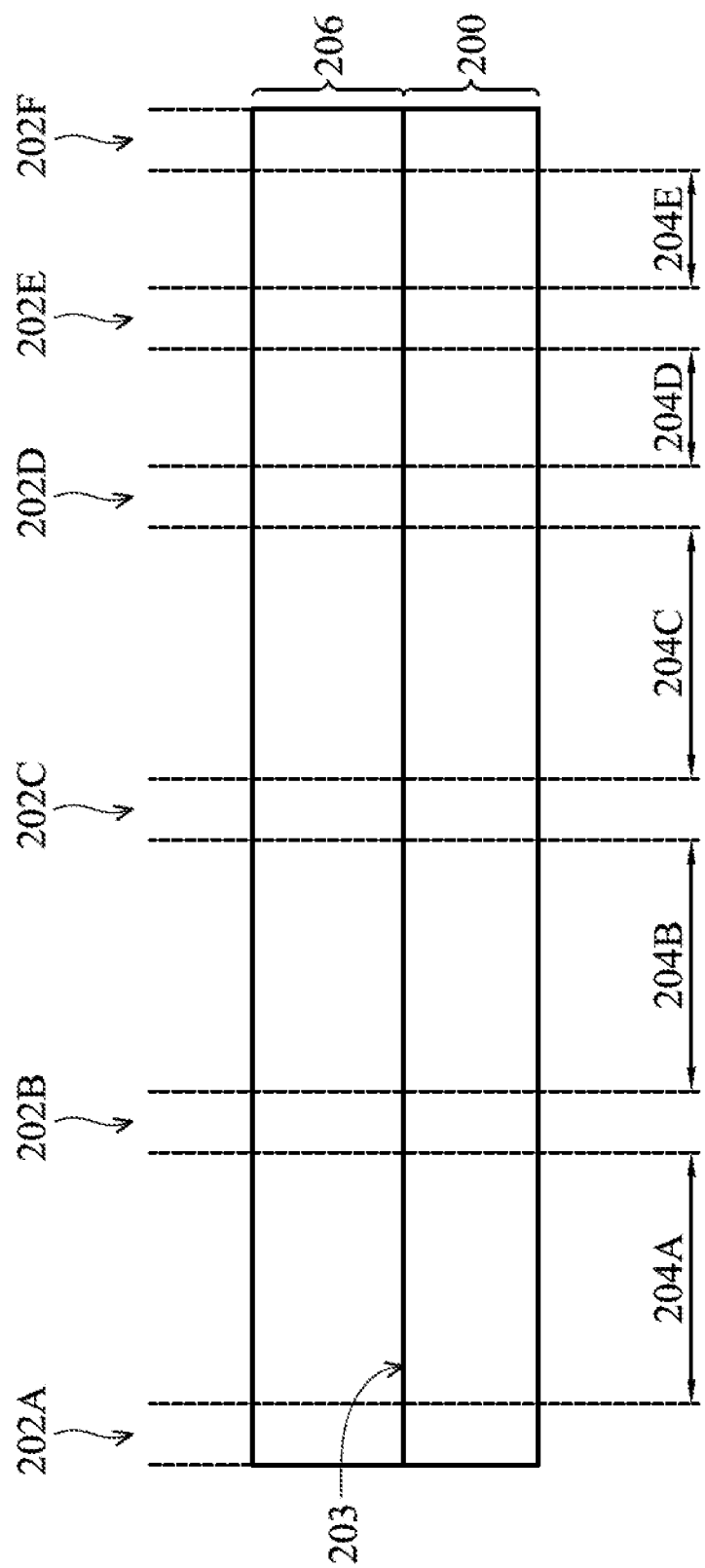
FIGS. 1-6 are schematic cross-sectional views showing intermediate stages of a method for fabricating a transient-voltage-suppression (TVS) diode device in accordance with some embodiments of the disclosure.

As shown in FIG. 1, the substrate 200 may comprise a plurality of defined regions 202A, 202B, 202C, 202D, 202E and 202F for a plurality of trench isolation features to define formation positions of the following Zener diode and other diodes. In some embodiments, as shown in FIG. 1, defined regions 202A, 202B, 202C, 202D, 202E and 202F are sequentially arranged form left to right along a direction that is substantially parallel to the top surface 203 of the substrate 200. The defined regions 202A, 202B, 202C, 202D, 202E and 202F divide the substrate 200 into a plurality of active regions 204A, 204B, 204C, 204D, 204E and 204F, which are close to each other. More specifically, the active region 204A is a region defined by defined regions 202A and 202B. The active region 204B is a region defined by defined regions 202B and 202C. The active region 204C is a region defined by defined regions 202C and 202D. The active region 204D is a region defined by defined regions 202D and 202E. The active region 204E is a region defined by defined regions 202E and 202F. Additionally, the active region 204A and active region 204C are separately positioned on opposite sides of the active region 204B. The active region 204C and active region 204E are separately positioned on opposite sides of the active region 204D.

Please refer to FIG. 1. Next, an epitaxial growth process is performed to epitaxially grow a second conductivity type epitaxial layer 206 on the entire top surface 203 of the substrate 200. The epitaxial growth process may comprise a metal-organic chemical vapor deposition (MOCVD) process, a metal-organic vapor phase epitaxy (MOVPE) process, a plasma-enhanced CVD process, a remote plasma chemical vapor deposition (RP-CVD) process, a molecular beam epitaxy (MBE) process, a hydride vapor phase epitaxy (HVPE) process, a liquid phase epitaxy (LPE) process, a chloride vapor-phase epitaxy (Cl-VPE) process, or the like. In some embodiments, an in-situ doping process is performed by adding phosphine or arsine (AsH$_3$) into the reactive gases during the epitaxial growth process to form the second conductivity type epitaxial layer 206. In some embodiments, an un-doped epitaxial layer is grown (now shown). Next, the un-doped epitaxial layer is doped with the phosphorus ions or arsenic ions to form the second conductivity type epitaxial layer 206.

The second conductivity type epitaxial layer 206 is formed of silicon, germanium, silicon and germanium, III-V compound semiconductors, or a combination thereof. The second conductivity type epitaxial layer 206 has a second conductivity type that is different form the first conductivity type. For example, when the first conductivity type is P-type, the second conductivity type is N-type. Also, the second conductivity type epitaxial layer 206 may serve as an N-type epitaxial layer 206. In some embodiments, the dopant concentration of the second conductivity type epitaxial layer 206 is about $10^{10}$-$10^{14}$/cm$^3$. The thickness of the second conductivity type epitaxial layer 206 is about 3 µm-8 µm, for example, about 5 µm.

Figure 2:
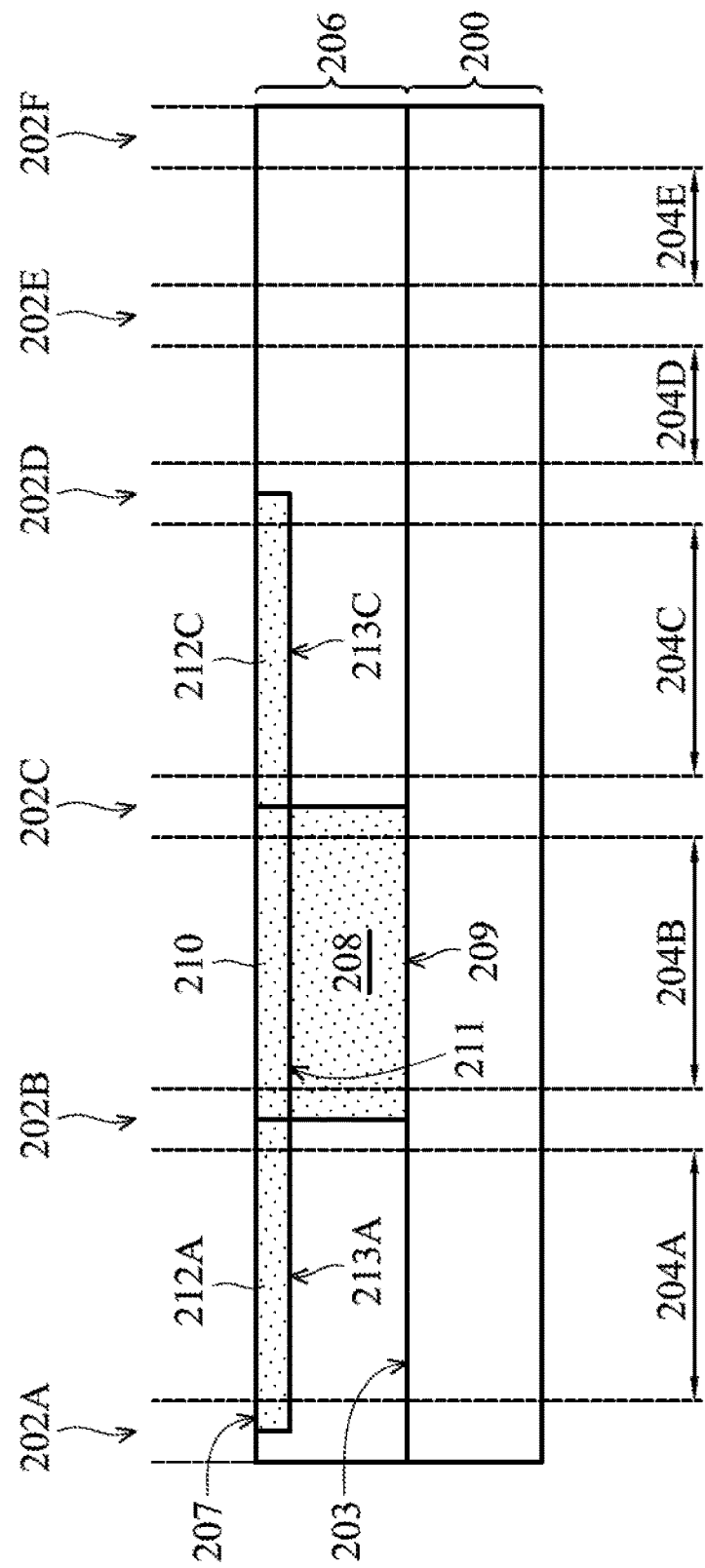

Next, please refer to FIG. 2. A doping process is performed to form a first conductivity type doped well region 208 in the second conductivity type epitaxial layer 206 within the active region 204B. The first conductivity type doped well region 208 has the first conductivity type. For example, when the first conductivity type is P-type, the first conductivity type doped well region 208 may serve as a P-type doped well region 208. In some embodiments, the dopant concentration of the first conductivity type doped well region 208 is about $10^{16}$-$10^{18}$/cm$^3$. The bottom surface 209 of the first conductivity type doped well region 208 is in contact with the top surface 203 of the substrate 200. The bottom surface 209 of the first conductivity type doped well region 208 is aligned with the bottom surface of the second conductivity type epitaxial layer 206 (the position is the same as the top surface 203 of the substrate 200). Additionally, two sides of the first conductivity type doped well region 208 are respectively positioned in the defined regions 202B and 202C.

Please refer to FIG. 2. Next, another doping process is performed to form a first conductivity type buried layer 210 in the second conductivity type epitaxial layer 206 and on the first conductivity type doped well region 208 within the active region 204B. The first conductivity type buried layer 210 has the first conductivity type. For example, when the first conductivity type is P-type, the first conductivity type buried layer 210 may serve as a P-type buried layer 210. In some embodiments, the dopant concentration of the first conductivity type buried layer 210 is greater than that of the first conductivity type doped well region 208. For example, the dopant concentration of the first conductivity type buried layer 210 is about $10^{18}$-$10^{21}$/cm$^3$. In some embodiments, the dopant concentration of the first conductivity type buried layer 210 can be designed at least one order of magnitude greater than that of the first conductivity type doped well region 208. For example, when the dopant concentration of the first conductivity type doped well region 208 is about $10^{17}$/cm$^3$, the dopant concentration of the first conductivity type buried layer 210 is about $10^{18}$-$10^{21}$/cm$^3$. Also, the top surface of the first conductivity type buried layer 210 is aligned with the top surface 207 of the second conductivity type epitaxial layer 206. The bottom surface 211 of the first conductivity type buried layer 210 is adjacent to and in contact with the top surface of the first conductivity type doped well region 208.

Please refer to FIG. 2. Next, yet another doping process is performed to form a second conductivity type buried layers 212A and 212C, which have the second conductivity type, in the second conductivity type epitaxial layer 206 within the active regions 204A and 204C, respectively. For example, when the first conductivity type is P-type, the second conductivity type is N-type, and the second conductivity type buried layers 212A and 212C may serve as N-type buried layers 212A and 212C, respectively. In some embodiments, the dopant concentration of the second conductivity type buried layers 212A and 212C is about $10^{17}$-$10^{20}$/cm$^3$. Also, the top surface of the second conductivity type buried layer 212A and the top surface of the second conductivity type buried layer 212C are respectively aligned with the top surface 207 of the second conductivity type epitaxial layer 206. The bottom surface of the second conductivity type buried layer 212A and the bottom surface of the second conductivity type buried layer 212C are respectively aligned with the bottom surface 211 of the of the first conductivity type buried layer 210.

In some embodiments, a sequential order of the process sequence of the doping process for forming the first conductivity type buried layer 210 and the doping process for forming the second conductivity type buried layers 212A and 212C can be exchanged.

Figure 3:
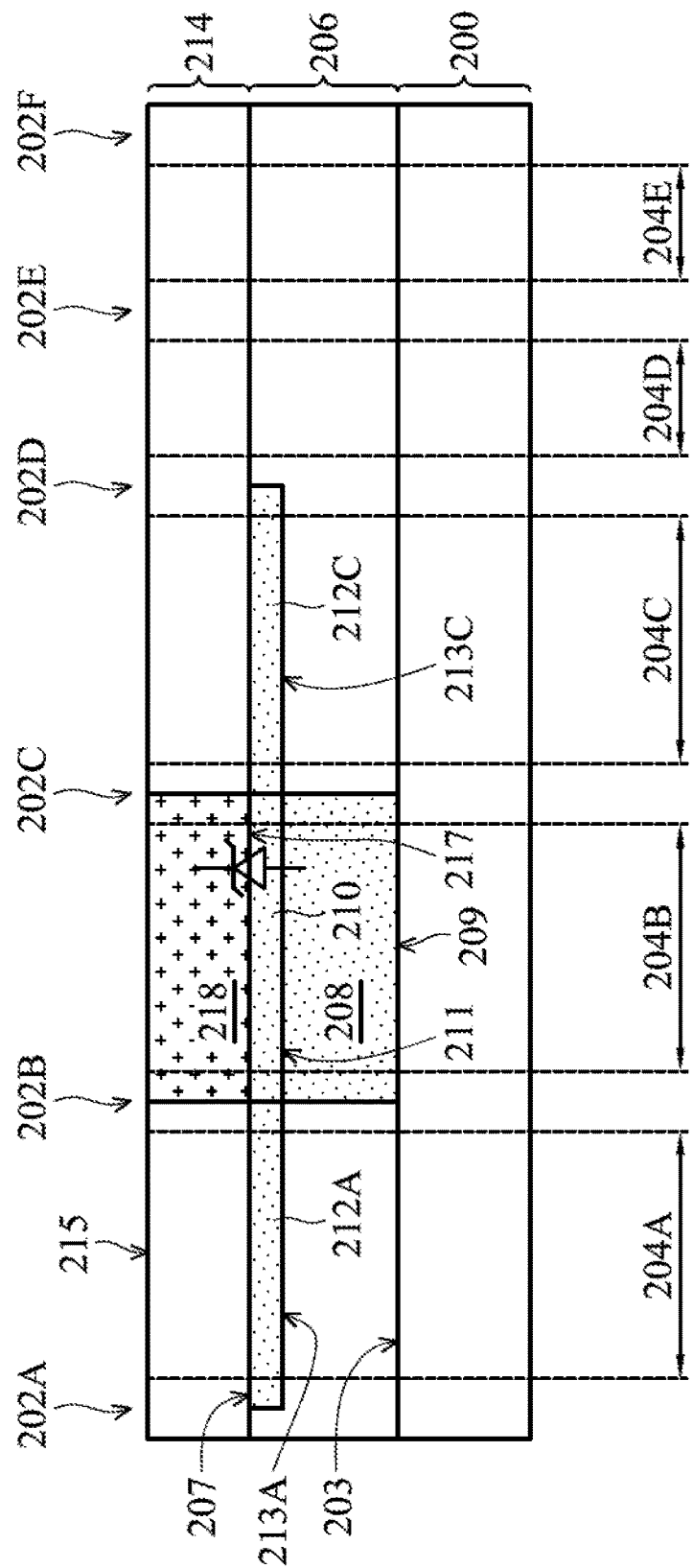

Please refer to FIG. 3. Next, another epitaxial growth process is performed to epitaxially grow a second conductivity type epitaxial layer 214 on the entire second conductivity type epitaxial layer 206. The second conductivity type epitaxial layer 214 fully covers the second conductivity type epitaxial layer 206. Also, the top surface 207 and the bottom surface 209 of the second conductivity type epitaxial layer 206 are respectively adjacent to the bottom surface of the second conductivity type epitaxial layer 214 and the top surface 203 of the substrate 200. The second conductivity type epitaxial layer 214 has the second conductivity type. For example, when the first conductivity type is P-type, the second conductivity type is N-type, and the second conductivity type epitaxial layer 214 may serve as an N-type epitaxial layer 214. In some embodiments, the processes, the dopant concentration and the thickness of the second conductivity type epitaxial layer 214 may be equal to or similar to those of the second conductivity type epitaxial layer 206.

In some other embodiments, the thickness of the second conductivity type epitaxial layer 214 may be greater than or less than the thickness of the second conductivity type epitaxial layer 206.

Next, please refer to FIG. 3. Another doping process is performed to form a second conductivity type doped well region 218 in the second conductivity type epitaxial layer 214 within the active region 204B. The second conductivity type doped well region 218 has the second conductivity type. For example, when the first conductivity type is P-type, the second conductivity type is N-type, and the second conductivity type doped well region 218 may serve as an N-type doped well region 218. In some embodiments, the dopant concentration of the second conductivity type doped well region 218 is about $10^{17}$-$10^{20}$/cm$^3$. The top surface of the second conductivity type doped well region 218 is aligned with the top surface 215 of the second conductivity type epitaxial layer 214. The bottom surface 217 of the second conductivity type doped well region 218 is in contact with the top surface 207 of the second conductivity type epitaxial layer 206, and is also in contact with the top surface of the first conductivity type buried layer 210. Additionally, two sides of the first conductivity type buried layer 210 are respectively positioned in the defined regions 202B and 202C.

Figure 4:
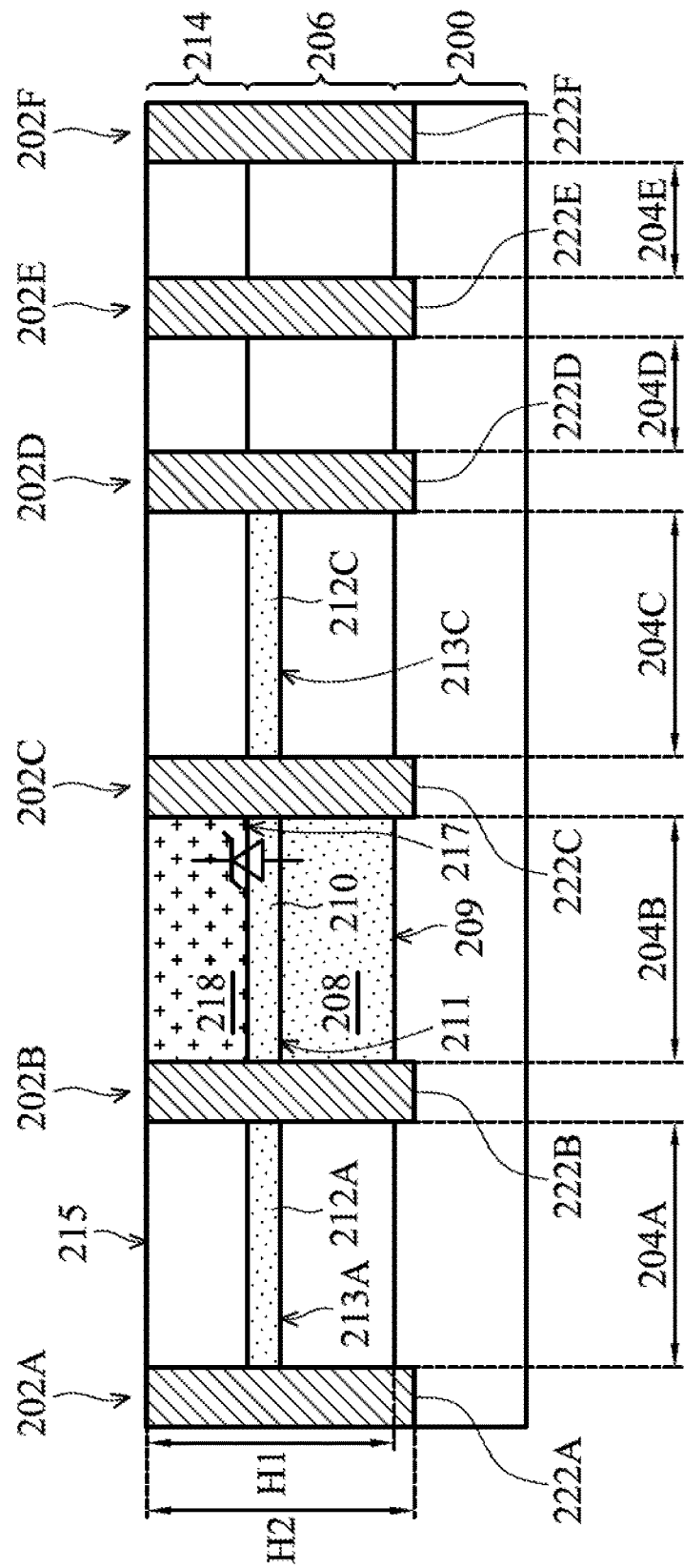

Please refer to FIG. 4. Next, a plurality of trench isolation features 222A, 222B, 222C, 222D, 222E and 222F are formed in the defined regions 202A, 202B, 202C, 202D, 202E and 202F, respectively. The trench isolation features 222A, 222B, 222C, 222D, 222E and 222F are formed extending into the substrate 200 from the top surface 215 of the second conductivity type epitaxial layer 214 and passing through the second conductivity type epitaxial layer 214 and the second conductivity type epitaxial layer 206. In other words, the depth H2 from the top surface to the bottom surface of each of the trench isolation features 222A, 222B, 222C, 222D, 222E and 222F is greater than the depth H1 from the top surface 215 of the second conductivity type epitaxial layer 214 to the bottom surface of the second conductivity type epitaxial layer 206.

In some embodiments, the trench isolation features 222A, 222B, 222C, 222D, 222E and 222F may comprise shallow trench isolation (STI) features. The trench isolation features 222A, 222B, 222C, 222D, 222E and 222F may be formed by an etching process, which is performed to etch the substrate 200, and a following isolation material filling process. The etching process removes a portion of the second conductivity type epitaxial layer 214 and a portion of the substrate 200 respectively within the defined regions 202A, 202B, 202C, 202D, 202E and 202F of the substrate 200, so that a plurality of trenches are formed. The trenches are formed extending into the substrate 200 from the top surface 215 of the second conductivity type epitaxial layer 214 and passing through the second conductivity type epitaxial layer 214 and the bottom surface of the second conductivity type epitaxial layer 206 (also positioned on the top surface 203 of the substrate 200). The etching process may comprise a wet etching process, a dry etching process or a combination thereof. The wet etching process may comprise an immersion etching process, a spray etching process, a combination thereof, or another suitable wet etching process. The dry etching process may comprise a capacitively coupled plasma (CCP) etching process, an inductively coupled plasma (ICP) etching process, a helicon wave plasma etching process, an electron cyclotron resonance (ECR) plasma etching process, a combination thereof, or another suitable dry etching process. The gases used in the dry etching process may comprise inert gases, fluorine-containing gases, chlorine-containing gases, bromide-containing gases, iodide-containing gases, a combination thereof, or other suitable gases. In some embodiments, gases used in the dry etching process may comprise Ar, $CF_4$, $SF_6$, $CH_2F_2$, $CHF_3$, $C_2F_6$, $Cl_2$, $CHCl_3$, $CCl_4$, HBr, $CHBr_3$, $BF_3$, $BCl_3$, a combination thereof, or another suitable gas.

In some embodiments, the isolation material filling process is performed to fill an isolation material in the trenches. The isolation material filling process may comprise a chemical vapor deposition (CVD) process, a low-pressure chemical vapor deposition (LPCVD), a low-temperature chemical vapor deposition (LTCVD) process, a rapid thermal chemical vapor deposition (RTCVD) process, a plasma enhanced chemical vapor deposition (PECVD) process, an atomic layer deposition (ALD) process, or another process in common use. Also, the isolation material may comprise silicon oxide, silicon nitride, silicon oxynitride, another suitable isolation material, or a combination thereof.

Figure 5:
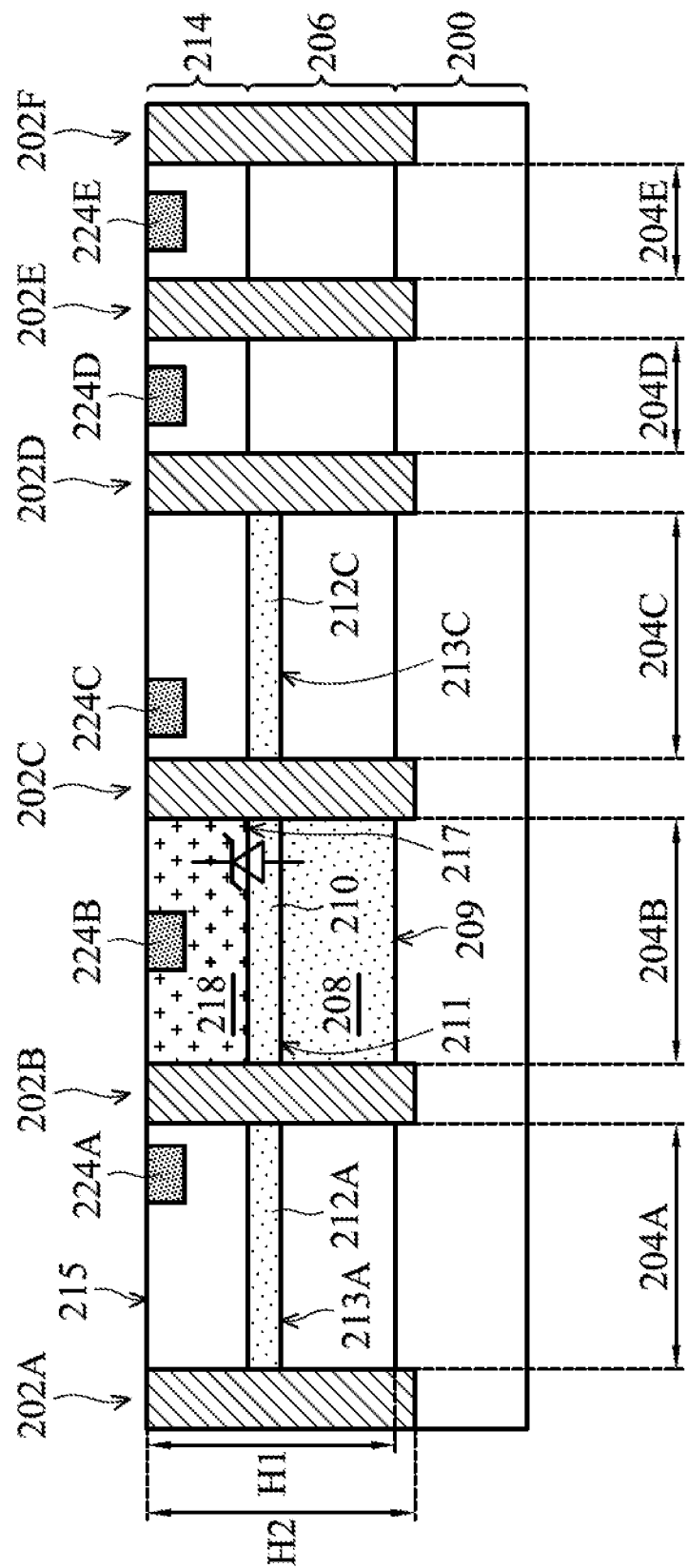

Next, please refer to FIG. 5. Another doping process is performed to form a second conductivity type heavily-doped region 224B on the second conductivity type doped well region 218 within the active region 204B. The second conductivity type heavily-doped region 224B has the second conductivity type. For example, when the first conductivity type is P-type, the second conductivity type is N-type, and the dopant concentration of the second conductivity type heavily-doped region 224B is about $10^{19}$-$10^{20}$/cm$^3$, the second conductivity type heavily-doped region 224B may serve as an N-type heavily-doped region (an N+ doped region) 224B.

In some embodiments, the doping process forms second conductivity type heavily-doped regions 224A, 224C, 224D and 224E in the second conductivity type epitaxial layer 214 within the active regions 204A, 204C, 204D and 204E, respectively. The dopant concentrations of second conductivity type heavily-doped regions 224A, 224C, 224D and 224E are the same as that of second conductivity type heavily-doped region 224B. Therefore, second conductivity type heavily-doped regions 224A, 224C, 224D and 224E may serve as N-type heavily-doped regions (N+ doped regions) 224A, 224C, 224D and 224E, respectively.

Figure 6:
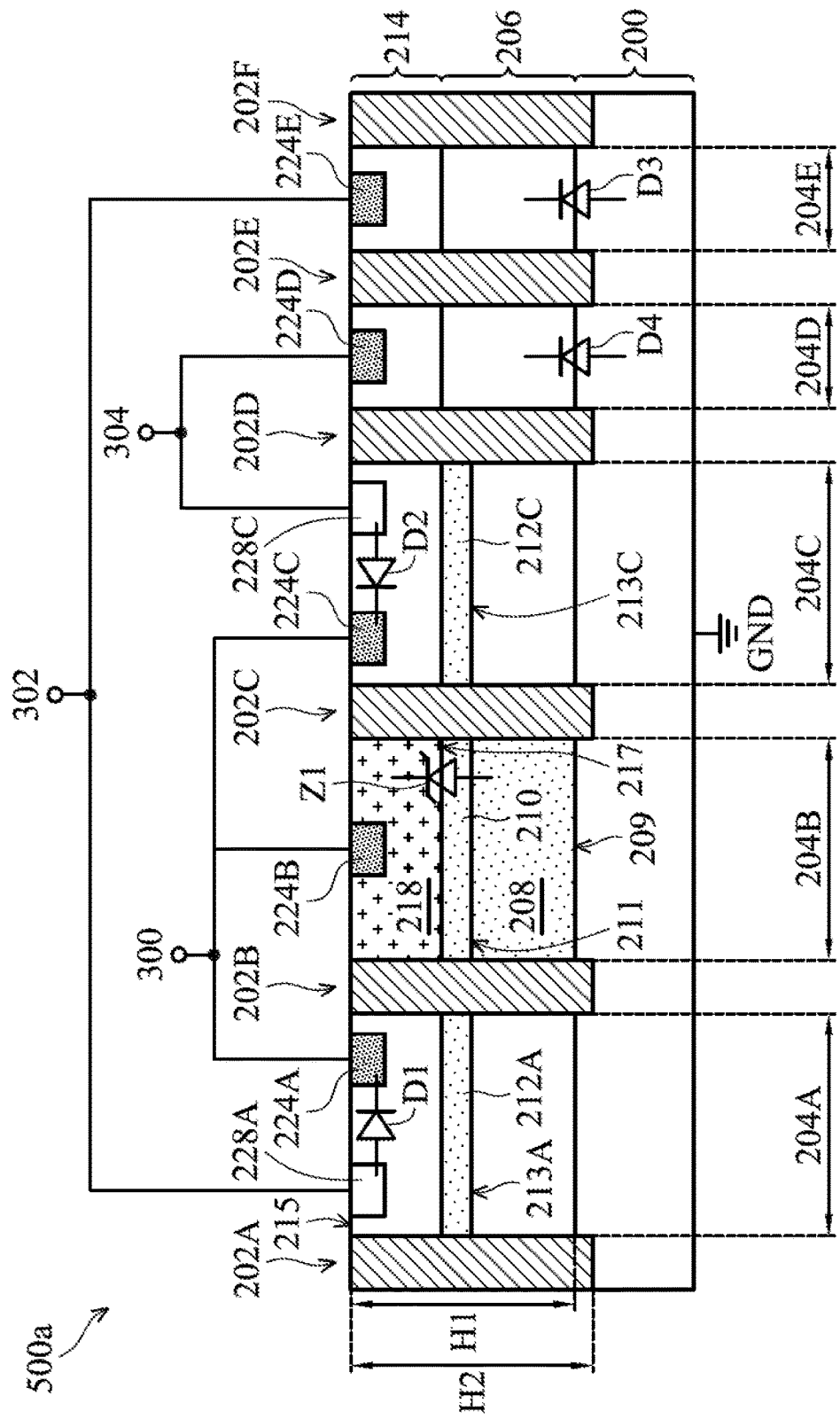

Please refer to FIG. 6. Next, another doping process is performed to form first conductivity type heavily-doped regions 228A and 228C in the second conductivity type epitaxial layer 214 within the active regions 204A and 204C, respectively. The first conductivity type heavily-doped regions 228A and 228C have the first conductivity type. For example, when the first conductivity type is P-type, and the dopant concentration of the first conductivity type heavily-doped regions 228A and 228C are about $10^{19}$-$10^{20}$/cm$^3$, the first conductivity type heavily-doped regions 228A and 228C may serve as a P-type heavily-doped region (P+ doped region) 224B. After the aforementioned processes, the transient-voltage-suppression (TVS) diode device 500a in accordance with some embodiments of the disclosure is formed.

As shown in FIG. 6, in some embodiments, the substrate 200 of the TVS diode device 500a is electrically coupled to a ground terminal, which is labeled "GND" and marked with the ground symbol at the bottom of the substrate 200 in FIG. 6. The second conductivity type heavily-doped regions 224A, 224B and 224C respectively in the active regions 204A, 204B and 204C are collectively electrically coupled to a high-voltage power supply node (Vcc node) 300. The first conductivity type heavily-doped region 228A in the active region 204A and the second conductivity type heavily-doped region 224E in the active region 204E are collectively electrically coupled to a first input/output node (I/O node) 302. The first conductivity type heavily-doped region 228C in the active region 204C and the second conductivity type heavily-doped region 224D in the active region 204D are collectively electrically coupled to a second input/output node (I/O node) 304.

As shown in FIG. 6, a PN junction is formed at an interface between the second conductivity type doped well region 218 and the first conductivity type buried layer 210 in the active region 204B. The PN junction is labeled "Z1" and marked with the circuit symbol of the Zener diode at the interface between the second conductivity type doped well region 218 and the first conductivity type buried layer 210 in the active region 204B shown in FIG. 6. The Zener diode Z1 is constructed by the second conductivity type heavily-doped region 224B, the second conductivity type doped well region 218, the first conductivity type buried layer 210 and the first conductivity type doped well region 208. According to the aforementioned electrical connections of the TVS diode device 500a, the cathode of the Zener diode Z1 (the second conductivity type doped well region 218 and the second conductivity type heavily-doped region 224B) is electrically coupled to the Vcc node 300. The anode of the Zener diode Z1 (the first conductivity type doped well region 208 and the first conductivity type buried layer 210) is electrically coupled to the ground terminal GND through the substrate 200. In some embodiments, the dopant concentration of the first conductivity type buried layer 210 is designed to be at least two orders of magnitude greater than that of the first conductivity type doped well region 208. Therefore, the Zener diode Z1 formed by the second conductivity type doped well region 218 and the first conductivity type buried layer 210 may have a high breakdown voltage, for example, about 18-20 volts (V). Also, the Zener diode Z1 may have a small capacitance.

As shown in FIG. 6, a PN junction is formed at an interface between the first conductivity type heavily-doped region 228A and the second conductivity type epitaxial layer 214 in the active region 204A. The PN junction is labeled "D1" and marked with the circuit symbol of the diode at the interface between the first conductivity type heavily-doped region 228A and the second conductivity type epitaxial layer 214 (and the second conductivity type heavily-doped region 224A) shown in FIG. 6. The diode D1 is constructed by the first conductivity type heavily-doped region 228A, the second conductivity type epitaxial layer 214 and the second conductivity type heavily-doped region 224A in the active region 204A. According to the aforementioned electrical connections of the TVS diode device 500a, the anode of the diode D1 (the first conductivity type heavily-doped region 228A) is electrically coupled to the first I/O node 302. The cathode of the diode D1 (the second conductivity type epitaxial layer 214 and the second conductivity type heavily-doped region 224A) is electrically coupled to the Vcc node 300 and the cathode of the Zener diode Z1.

As shown in FIG. 6, similarly, a PN junction is formed at an interface between the first conductivity type heavily-doped region 228C and the second conductivity type epitaxial layer 214 in the active region 204C. The PN junction is labeled "D2" and marked with the circuit symbol of the diode at the interface between the first conductivity type heavily-doped region 228C and the second conductivity type epitaxial layer 214 (and the second conductivity type heavily-doped region 224C) shown in FIG. 6. The diode D2 is constructed by the first conductivity type heavily-doped region 228C, the second conductivity type epitaxial layer 214 and the second conductivity type heavily-doped region 224C in the active region 204C. According to the aforementioned electrical connections of the TVS diode device 500a, the anode of the diode D2 (the first conductivity type heavily-doped region 228C) is electrically coupled to the second I/O node 304. The cathode of the diode D2 (the second conductivity type epitaxial layer 214 and the second conductivity type heavily-doped region 224C) is electrically coupled to the Vcc node 300 and the cathode of the Zener diode Z1.

Also, as shown in FIG. 6, a PN junction is formed at an interface between the second conductivity type epitaxial layer 214 (and the second conductivity type epitaxial layer 206) and the substrate 200 having the first conductivity type in the active region 204D. The PN junction is labeled "D4" and marked with the circuit symbol of the diode at the interface between the second conductivity type epitaxial layer 206 in the active region 204D and the substrate 200 having the first conductivity type shown in FIG. 6. The diode D4 is constructed by the second conductivity type heavily-doped region 224D, the second conductivity type epitaxial layer 206, the second conductivity type epitaxial layer 214 and the substrate 200 in the active region 204D. According to the aforementioned electrical connections of the TVS diode device 500a, the anode of the diode D4 (the substrate 200) is electrically coupled to the ground terminal GND. The cathode of the diode D4 (the second conductivity type heavily-doped region 224D, the second conductivity type epitaxial layer 206 and the second conductivity type epitaxial layer 214) is electrically coupled to the second I/O node 304.

Figure 7:
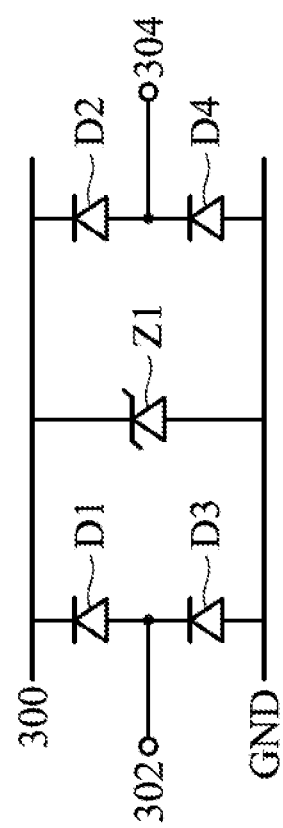
FIG. 7 is an equivalent circuit diagram of a transient-voltage-suppression (TVS) diode device in accordance with some embodiments of the disclosure as shown in FIG. 6.

As shown in FIG. 6, similarly, a PN junction is formed at an interface between the second conductivity type epitaxial layer 206 and the substrate 200 having the first conductivity type in the active region 204E. The PN junction is labeled "D3" and marked with the circuit symbol of the diode at the interface between the second conductivity type epitaxial layer 206 and the substrate 200 having the first conductivity type in the active region 204E shown in FIG. 6. The diode D3 is constructed by the second conductivity type heavily-doped region 224E, the second conductivity type epitaxial layer 206, the second conductivity type epitaxial layer 214 and the substrate 200 in the active region 204E. According to the aforementioned electrical connections of the TVS diode device 500a, the anode of the diode D3 (the substrate 200) is electrically coupled to the ground terminal GND. The cathode of the diode D3 (the second conductivity type heavily-doped region 224E, the second conductivity type epitaxial layer 206 and the second conductivity type epitaxial layer 214) is electrically coupled to the first I/O node 302. FIG. 7 is an equivalent circuit diagram of the TVS diode device 500a in accordance with some embodiments of the disclosure.

FIGS. 8-12 are schematic cross-sectional views showing intermediate stages of a method for fabricating a transient-voltage-suppression (TVS) diode device 500b in accordance with some other embodiments of the disclosure. Elements of the embodiments hereinafter that are the same or similar as those previously described with reference to FIGS. 1-6, are not repeated for brevity.

Figure 8:
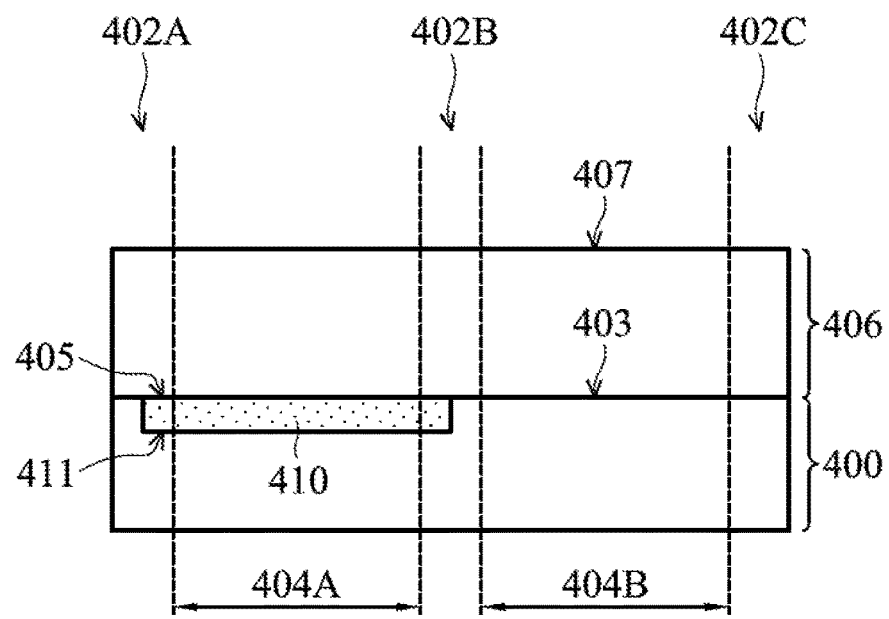
FIGS. 8-12 are schematic cross-sectional views showing intermediate stages of a method for fabricating a transient-voltage-suppression (TVS) diode device in accordance with some other embodiments of the disclosure.

Please refer to FIG. 8. A substrate 400 is provided. The substrate 400 has a first conductivity type by doping dopants. For example, when the first conductivity type is P-type, and the substrate 400 is a P-type substrate. In some embodiments, the materials and the dopant concentration of the substrate 400 may be the same as or similar to those of the substrate 200 shown in FIG. 1.

As shown in FIG. 8, the substrate 400 may comprise a plurality of defined regions 402A, 402B and 402C for a plurality of trench isolation features to define formation positions of the following Zener diode and other diodes. In some embodiments, as shown in FIG. 8, the defined regions 402A, 402B and 402C are sequentially arranged form left to right along a direction that is substantially parallel to the top surface 403 of the substrate 400. The defined regions 402A, 402B and 402C divide the substrate 400 into a plurality of active regions 404A and 404B, which are close to each other. More specifically, the active region 404A is a region defined by the defined regions 402A and 402B. The active region 404B is a region defined by the defined regions 402B and 402C. Additionally, the active region 404A is close to the active region 404B and separated from the active region 404B by a single defined region 402B.

Please refer to FIG. 8. Next, a doping process is performed to form a first conductivity type buried layer 410 within the active region 404A before formation of the second conductivity type epitaxial layer 406. The first conductivity type buried layer 410 has the first conductivity type. For example, when the first conductivity type is P-type, the first conductivity type buried layer 410 may serve as a P-type buried layer 410. In some embodiments, the dopant concentration of the first conductivity type buried layer 410 is about $10^{18}$-$10^{21}$/cm$^3$. Also, the top surface 405 of the first conductivity type buried layer 410 is lower than the top surface 407 of the second conductivity type epitaxial layer 406. The bottom surface 411 of the first conductivity type buried layer 410 is lower than the bottom surface of the second conductivity type epitaxial layer 406. Additionally, two sides of the first conductivity type buried layer 410 are respectively positioned in the defined regions 402A and 402B.

Please refer to FIG. 8. Next, an epitaxial growth process is performed to epitaxially grow a second conductivity type epitaxial layer 406 on the entire top surface 403 of the substrate 400. The second conductivity type epitaxial layer 406 may be formed using processes that are the same as or similar to the processes for forming the second conductivity type epitaxial layer 206 shown in FIG. 1. In some embodiments, the materials, the dopant concentration and the thickness of the second conductivity type epitaxial layer 406 may be the same as or similar to those of the second conductivity type epitaxial layer 206 shown in FIG. 1.

Figure 9:
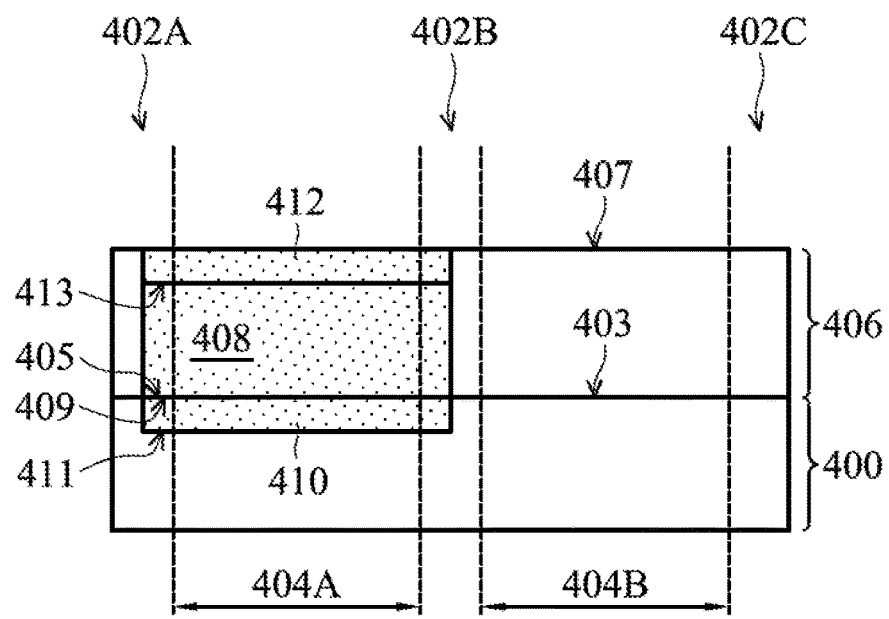

Please refer to FIG. 9. Next, another doping process is performed to form a first conductivity type doped well region 408 in the second conductivity type epitaxial layer 406 within the active region 404A. The first conductivity type doped well region 408 has the first conductivity type. For example, when the first conductivity type is P-type, the first conductivity type doped well region 408 may serve as a P-type doped well region 408. In some embodiments, the dopant concentration of the first conductivity type doped well region 408 is about $10^{17}$-$10^{20}$/cm$^3$. In some embodiments, the dopant concentration of the first conductivity type buried layer 410 is at least one order of magnitude greater than that of the first conductivity type doped well region 408. For example, when the dopant concentration of the first conductivity type doped well region 408 is about $10^{17}$/cm$^3$, the dopant concentration of the first conductivity type buried layer 410 is about $10^{18}$-$10^{20}$/cm$^3$. The bottom surface 409 of the first conductivity type doped well region 408 is in contact with the top surface 405 of the first conductivity type buried layer 410. Additionally, two sides of the first conductivity type doped well region 408 are respectively positioned in the defined regions 402A and 402B.

Please refer to FIG. 9. Next, yet another doping process is performed to form a second conductivity type buried layer 412, which have the second conductivity type, in the second conductivity type epitaxial layer 406 within the active region 404A. The second conductivity type buried layer 412 is also formed on the first conductivity type doped well region 408. For example, when the first conductivity type is P-type, the second conductivity type is N-type, and the second conductivity type buried layer 412 may serve as an N-type buried layer 412. In some embodiments, the dopant concentration of the second conductivity type buried layer 412 is about $10^{18}$-$10^{21}$/cm$^3$. Also, the top surface of the second conductivity type buried layer 412 is aligned with the top surface 407 of the second conductivity type epitaxial layer 406. The bottom surface 413 of the second conductivity type buried layer 412 is in contact with the top surface of the first conductivity type doped well region 408. Additionally, two sides of the second conductivity type buried layer 412 are respectively positioned in the defined regions 402A and 402B.

Figure 10:
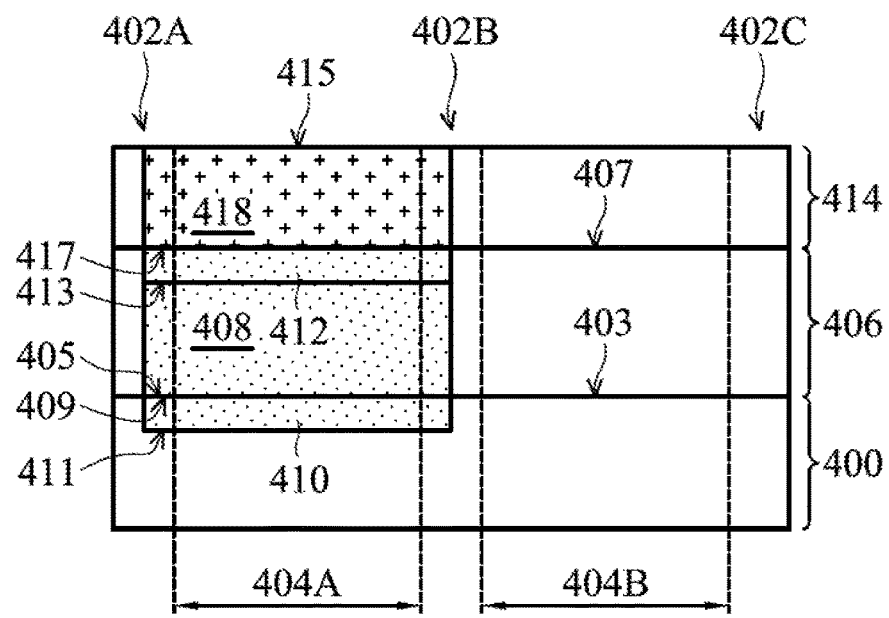

Please refer to FIG. 10. Next, another epitaxial growth process is performed to epitaxially grow a second conductivity type epitaxial layer 414 on the entire second conductivity type epitaxial layer 406. The second conductivity type epitaxial layer 414 fully covers the second conductivity type epitaxial layer 406. Also, the second conductivity type epitaxial layer 406 is respectively adjacent to the bottom surface 417 of the second conductivity type epitaxial layer 414 and the top surface 403 of the substrate 400. The second conductivity type epitaxial layer 414 has the second conductivity type. For example, when the first conductivity type is P-type, the second conductivity type is N-type, and the second conductivity type epitaxial layer 414 may serve as an N-type epitaxial layer 414. In some embodiments, the processes, the dopant concentration and the thickness of the second conductivity type epitaxial layer 414 may be equal to or similar to those of the second conductivity type epitaxial layer 406.

Please refer to FIG. 10. Next, another doping process is performed to form a second conductivity type doped well region 418 in the second conductivity type epitaxial layer 414 within the active region 404A. The second conductivity type doped well region 418 has the second conductivity type. For example, when the first conductivity type is P-type, the second conductivity type is N-type, and the second conductivity type doped well region 418 may serve as an N-type doped well region 418. In some embodiments, the dopant concentration of the second conductivity type doped well region 418 may be the same as or similar to that of the second conductivity type doped well region 218 shown in FIG. 3. The top surface of the second conductivity type doped well region 418 is aligned with the top surface 415 of the second conductivity type epitaxial layer 414. The bottom surface 417 of the second conductivity type doped well region 418 is in contact with the top surface 407 of the second conductivity type epitaxial layer 406 and the top surface of the first conductivity type buried layer 412. Additionally, two sides of the second conductivity type doped well region 418 are respectively positioned in the defined regions 402A and 402B.

Figure 11:
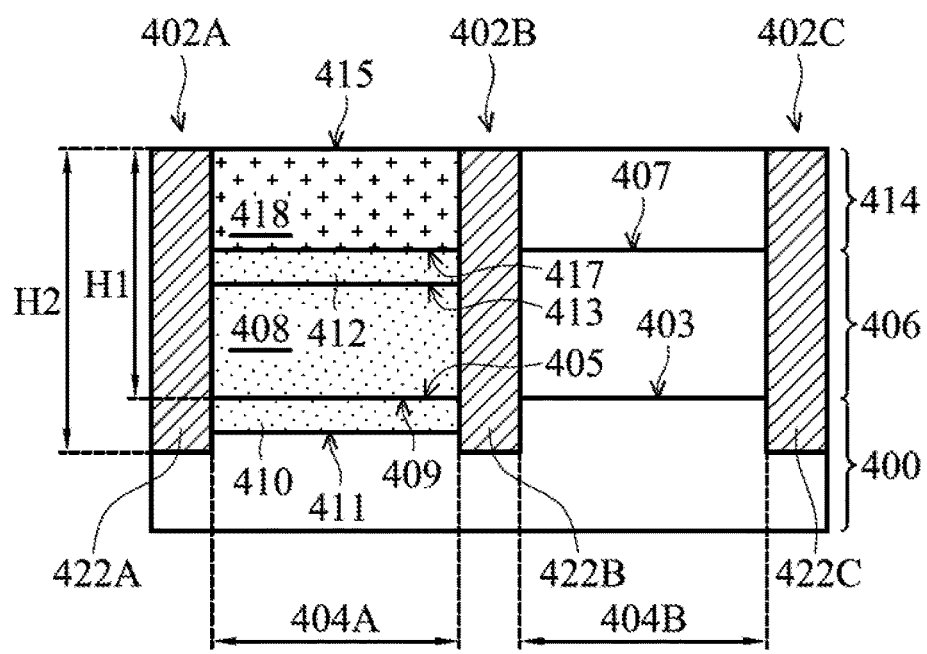

Please refer to FIG. 11. Next, a plurality of trench isolation features 422A, 422B and 422C are formed in the defined regions 402A, 402B and 402C, respectively. The positions, the depth H2, the materials and the processes of the trench isolation features 422A, 422B and 422C are the same as or similar to those of the trench isolation features 222A, 222B, 222C, 222D, 222E and 222F shown in FIG. 4.

Figure 12:
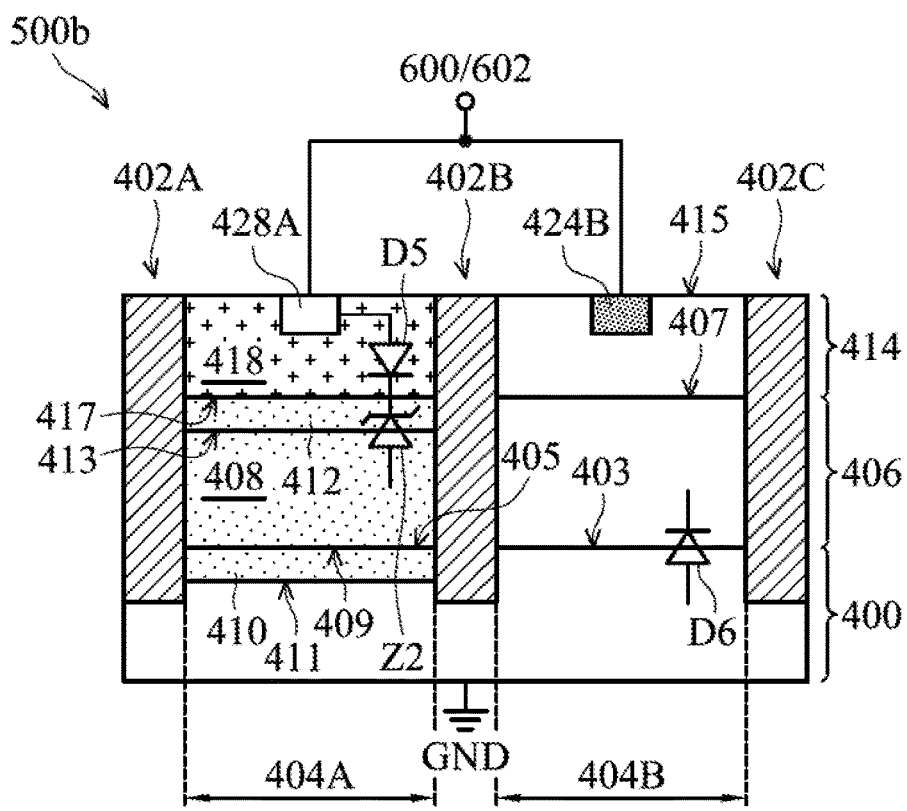

Please refer to FIG. 12. Next, another doping process is performed to form a first conductivity type heavily-doped region 428A on the second conductivity type doped well region 418 within the active region 404A. The first conductivity type heavily-doped region 428A has the first conductivity type. For example, when the first conductivity type is P-type, and the dopant concentration of the first conductivity type heavily-doped region 428A is about $10^{19}$-$10^{20}$/cm$^3$, the first conductivity type heavily-doped region 428A may serve as a P-type heavily-doped region (P+ doped region) 428A.

Please refer to FIG. 12. Next, another doping process is performed to form a second conductivity type heavily-doped region 424B in the second conductivity type epitaxial layer 414 within the active region 404B. The second conductivity type heavily-doped region 424B has the second conductivity type. For example, when the first conductivity type is P-type, the second conductivity type is N-type, and the dopant concentration of the second conductivity type heavily-doped region 424B is about $10^{19}$-$10^{20}$/cm$^3$, the second conductivity type heavily-doped region 424B may serve as an N-type heavily-doped region (an N+ doped region) 424B. The sequence of the doping process of the first conductivity type heavily-doped region 428A and the doping process of the second conductivity type heavily-doped region 424B can be switched. After the aforementioned processes, the transient-voltage-suppression (TVS) diode device 500b in accordance with some embodiments of the disclosure is formed.

As shown in FIG. 12, in some embodiments, the substrate 400 of the TVS diode device 500b is electrically coupled to a ground terminal, which is labeled "GND" and marked with the ground symbol at the bottom of the substrate 400 in FIG. 12. The first conductivity type heavily-doped region 428A within the active region 404A and the second conductivity type heavily-doped region 424B within the active region 404B are collectively electrically coupled to a high-voltage power supply node (Vcc node) 600 or an input/output node (I/O node) 602.

As shown in FIG. 12, a PN junction is formed at an interface between the first conductivity type doped well region 408 and the second conductivity type buried layer 412, which is positioned on the first conductivity type doped well region 408, in the active region 404A of the TVS diode device 500b. The PN junction serves as a Zener diode, which is labeled "Z2" and marked with the circuit symbol of the Zener diode at the interface between the first conductivity type doped well region 408 and the second conductivity type buried layer 412 shown in FIG. 12. The Zener diode Z2 is constructed by the second conductivity type buried layer 412, the first conductivity type doped well region 408 and the first conductivity type buried layer 410. In some embodiments, the dopant concentration of the second conductivity type buried layer 412 is designed to be at least two orders of magnitude greater than that of the second conductivity type doped well region 418. Therefore, the Zener diode Z2 formed by the first conductivity type doped well region 408 and the second conductivity type buried layer 412 may have a stable breakdown voltage, for example, about 18-20 volts (V).

As shown in FIG. 12, a PN junction is formed at an interface between the first conductivity type heavily-doped region 428A and the second conductivity type doped well region 418 in the active region 404A of the TVS diode device 500b. The PN junction is labeled "D5" and marked with the circuit symbol of the diode at the interface between the first conductivity type heavily-doped region 428A and the second conductivity type doped well region 418 shown in FIG. 12. The diode D5 is constructed by the first conductivity type heavily-doped region 428A, the second conductivity type doped well region 418 and the second conductivity type buried layer 412. According to the aforementioned electrical connections of the TVS diode device 500b, the cathode of the Zener diode Z2 (the second conductivity type buried layer 412) is electrically coupled to the cathode of the diode D5 (the second conductivity type doped well region 418 and the second conductivity type buried layer 412). The anode of the Zener diode Z2 (the first conductivity type doped well region 408 and the first conductivity type buried layer 410) is electrically coupled to the ground terminal GND through the substrate 400. Also, the anode of the diode D5 (the first conductivity type heavily-doped region 428A) is electrically coupled to the high-voltage power supply node (Vcc node) 600 or the input/output node (I/O node) 602.

Figure 13:
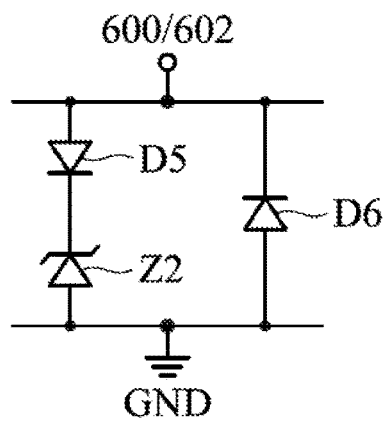
FIG. 13 is an equivalent circuit diagram of a transient-voltage-suppression (TVS) diode device in accordance with some other embodiments.

As shown in FIG. 12, a PN junction is formed at an interface between the second conductivity type epitaxial layer 406 and the substrate 400 having the first conductivity type in the active region 404B. The PN junction is labeled "D6" and marked with the circuit symbol of the diode at the interface between the second conductivity type epitaxial layer 406 and the substrate 400 having the first conductivity type in the active region 404B shown in FIG. 12. The diode D6 is constructed by the second conductivity type heavily-doped region 424B, the second conductivity type epitaxial layer 406, the second conductivity type epitaxial layer 414 and the substrate 400 having the first conductivity type. According to the aforementioned electrical connections of the TVS diode device 500b, the anode of the diode D6 (the substrate 400) is electrically coupled to the ground terminal GND. The cathode of the diode D3 (the second conductivity type heavily-doped region 424B, the second conductivity type epitaxial layer 406 and the second conductivity type epitaxial layer 414) is electrically coupled to the high-voltage power supply node (Vcc node) 600 or the input/output node (I/O node) 602. FIG. 13 is an equivalent circuit diagram of the TVS diode device 500b in accordance with some embodiments of the disclosure.

Embodiments provide a transient-voltage-suppression (TVS) diode device. The Zener diode formed in the TVS diode device has a stable reverse breakdown voltage. Also, the TVS diode device has the advantages of low leakage current and low capacitance. Therefore, the TVS diode device can be used for protecting the high frequency circuit applications from electrostatic discharge (ESD) surge energy and transient voltage overstress (or transient current overstress). Additionally, the TVS diode device is constructed by two epitaxial thin film growth processes and several doping processes. The fabrication steps of the TVS diode device are simple and the fabrication cost can be reduced.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A transient-voltage-suppression (TVS) diode device, comprising:
   a substrate having a first conductivity type;
   a second conductivity type first epitaxial layer disposed over the substrate, wherein the second conductivity type first epitaxial layer has a second conductivity type that is different from the first conductivity type;
   a second conductivity type second epitaxial layer disposed between the second conductivity type first epitaxial layer and the substrate, wherein the second conductivity type second epitaxial layer has the second conductivity type; and
   a plurality of trench isolation features formed extending into the substrate from a top surface of the second conductivity type first epitaxial layer and passing through a bottom surface of the second conductivity type second epitaxial layer, wherein the plurality of trench isolation features close to each other divide the substrate into a first active region;
   wherein the first active region comprises:
      a second conductivity type doped well region disposed in the second conductivity type first epitaxial layer, having the second conductivity type;
      a first conductivity type doped well region disposed in the second conductivity type second epitaxial layer, having the first conductivity type; and
      a first conductivity type buried layer disposed in the second conductivity type second epitaxial layer;
      wherein the second conductivity type doped well region and the first conductivity type buried layer collectively form a Zener diode.

2. The TVS diode device as claimed in claim 1, wherein the first active region comprises a second conductivity type first heavily-doped region disposed on the second conductivity type doped well region and having the second conductivity type;
   wherein the plurality of trench isolation features further divide the substrate into a second active region and a third active region, which are close to the first active region, wherein each of the second active region and the third active region respectively comprise:
      a second conductivity type buried layer disposed in the second conductivity type second epitaxial layer and adjacent to the bottom surface of the second conductivity type first epitaxial layer; and
      a first conductivity type second heavily-doped region and a second conductivity type second heavily-doped region respectively disposed in the second conductivity type first epitaxial layer.

3. The TVS diode device as claimed in claim 2, wherein the second conductivity type first epitaxial layer, the first conductivity type second heavily-doped region and the second conductivity type second heavily-doped region in the second active region collectively form a second diode, wherein the second conductivity type first epitaxial layer, the first conductivity type second heavily-doped region and the second conductivity type second heavily-doped region in the third active region collectively form a third diode.

4. The TVS diode device as claimed in claim 2, wherein the plurality of trench isolation features further divide the substrate into a fourth active region and a fifth active region, and each of the fourth active region and the fifth active region respectively comprises:
   a second conductivity type third heavily-doped region disposed in the second conductivity type first epitaxial layer;
   wherein the second conductivity type second epitaxial layer and the substrate in the fourth active region collectively form a fourth diode,
   wherein the second conductivity type second epitaxial layer and the substrate in the fifth active region collectively form a fifth diode.

5. The TVS diode device as claimed in claim 4, wherein the first active region comprises:
a second conductivity type buried layer disposed in the second conductivity type second epitaxial layer, wherein the first conductivity type buried layer and the second conductivity type buried layer respectively positioned on a bottom surface and a top surface of the first conductivity type doped well region; and
a first conductivity type first heavily-doped region disposed on the second conductivity type doped well region,
wherein the first conductivity type first heavily-doped region and the second conductivity type doped well region collectively form a first diode.

6. The TVS diode device as claimed in claim 1, wherein the second conductivity type second epitaxial layer is adjacent to a bottom surface of the second conductivity type first epitaxial layer and a top surface of the substrate.

7. A transient-voltage-suppression (TVS) diode device, comprising:
a substrate having a first conductivity type;
a second conductivity type first epitaxial layer and a second conductivity type second epitaxial layer disposed over the substrate, wherein a top surface and a bottom surface of the second conductivity type second epitaxial layer respectively adjacent to the second conductivity type first epitaxial layer and the substrate, wherein the second conductivity type first epitaxial layer and the second conductivity type second epitaxial layer have a second conductivity type that is different from the first conductivity type; and
a Zener diode formed in the second conductivity type first epitaxial layer and the second conductivity type second epitaxial layer;
wherein the Zener diode comprises:
a first conductivity type doped well region disposed in the second conductivity type second epitaxial layer, wherein the first conductivity type doped well region has the first conductivity type;
a second conductivity type doped well region disposed in the second conductivity type first epitaxial layer, wherein the second conductivity type doped well region has the second conductivity type; and
a first conductivity type buried layer disposed in the second conductivity type second epitaxial layer, wherein the first conductivity type buried layer has the first conductivity type.

8. The TVS diode device as claimed in claim 7, wherein the Zener diode comprises:
a second conductivity type first heavily-doped region disposed on the second conductivity type doped well region;
wherein a top surface and a bottom surface of the first conductivity type buried layer respectively adjacent to the second conductivity type doped well region and the first conductivity type doped well region; and
wherein the second conductivity type first heavily-doped region is electrically coupled to a second conductivity type second heavily-doped region positioned in the second conductivity type first epitaxial layer.

9. The TVS diode device as claimed in claim 8, further comprising:
at least one trench isolation feature formed extending into the substrate from a top surface of the second conductivity type first epitaxial layer and passing through a bottom surface of the second conductivity type second epitaxial layer, wherein the at least one trench isolation feature surrounds the Zener diode and separates the Zener diode from the second conductivity type second heavily-doped region.

10. The TVS diode device as claimed in claim 7, wherein the Zener diode comprises:
a second conductivity type buried layer disposed in the second conductivity type second epitaxial layer, wherein the second conductivity type buried layer is positioned on a top surface of the first conductivity type doped well region;
a first conductivity type first heavily-doped region disposed in the second conductivity type doped well region,
wherein the first conductivity type first heavily-doped region is electrically coupled to a second conductivity type first heavily-doped region positioned in the second conductivity type first epitaxial layer.

11. The TVS diode device as claimed in claim 10, further comprising:
at least one trench isolation feature formed extending into the substrate from a top surface of the second conductivity type first epitaxial layer and passing through a bottom surface of the second conductivity type second epitaxial layer, wherein the at least one trench isolation feature surrounds the Zener diode and separates the Zener diode from the second conductivity type first heavily-doped region.

12. A method for fabricating a transient-voltage-suppression (TVS) diode device, comprising:
providing a substrate having a first conductivity type, the substrate comprises a plurality of defined regions for a plurality of trench isolation features, wherein the plurality of defined regions divide the substrate into a first active region, a second active region, a third active region, a fourth active region and a fifth active region;
performing a first epitaxial growth process to epitaxially grow a second conductivity type epitaxial layer, wherein the second conductivity type epitaxial layer has a second conductivity type that is different from the first conductivity type;
performing a first doping process to form a first conductivity type doped well region in the second conductivity type epitaxial layer within the first active region, wherein the first conductivity type doped well region has the first conductivity type;
performing a second doping process to form a first conductivity type buried layer on the first conductivity type doped well region within the first active region, wherein the first conductivity type buried layer has the first conductivity type;
performing a second epitaxial growth process to epitaxially grow another second conductivity type epitaxial layer on the second conductivity type epitaxial layer, wherein the other second conductivity type epitaxial layer has the second conductivity type;
performing a third doping process to form a second conductivity type doped well region in the other second conductivity type epitaxial layer within the first active region, wherein the second conductivity type doped well region has the second conductivity type; and
forming a plurality of trench isolation features in the plurality of defined regions for a plurality of trench isolation features, wherein the plurality of trench isolation features is formed extending into the substrate from a top surface of the other second conductivity type epitaxial layer and passing through a bottom surface of the second conductivity type epitaxial layer.

13. The method as claimed in claim 12, further comprising:
   performing a fourth doping process to form a second conductivity type first heavily-doped region on the second conductivity type doped well region within the first active region after formation of the plurality of trench isolation features, wherein the second conductivity type first heavily-doped region has the second conductivity type.

14. The method as claimed in claim 13, further comprising:
   performing a fifth doping process to form a second conductivity type buried layer in the second conductivity type epitaxial layer within the second active region and the third active region before the second epitaxial growth process is performed,
   wherein the second conductivity type buried layer has the second conductivity type,
   wherein the first conductivity type buried layer is formed in the second conductivity type epitaxial layer by performing the second doping process.

15. The method as claimed in claim 14, further comprising:
   performing a sixth doping process to form a first conductivity type first heavily-doped region in the other second conductivity type epitaxial layer within the second active region and the third active region after forming the plurality of trench isolation features, wherein the first conductivity type first heavily-doped region has the first conductivity type.

16. The method as claimed in claim 12, further comprising:
   performing a seventh doping process to form a second conductivity type buried layer in the second conductivity type epitaxial layer in the first active region before formation of the second epitaxial growth process,
   wherein the second conductivity type buried layer has the second conductivity type,
   wherein the first conductivity type buried layer and the second conductivity type buried layer are respectively positioned on a bottom surface and a top surface of the first conductivity type doped well region, and
   wherein first conductivity type buried layer is formed in the substrate by performing the second doping process; and
   performing a eighth doping process to form a first conductivity type first heavily-doped region in the second conductivity type doped well region after formation of the plurality of trench isolation features, wherein the first conductivity type first heavily-doped region has the first conductivity type.

17. The method as claimed in claim 16, wherein the second doping process is performed before the first epitaxial growth process, and the seventh doping process is performed after the first doping process.

\* \* \* \* \*